(12) United States Patent
Catabay et al.

(10) Patent No.: US 7,220,362 B2
(45) Date of Patent: May 22, 2007

(54) PLANARIZATION WITH REDUCED DISHING

(75) Inventors: Wilbur G. Catabay, Saratoga, CA (US); Wei-Jen Hsia, Saratoga, CA (US); Hao Cui, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/337,460

(22) Filed: Jan. 23, 2006

(65) Prior Publication Data
US 2006/0118523 A1 Jun. 8, 2006

Related U.S. Application Data

(62) Division of application No. 10/421,068, filed on Apr. 23, 2003, now Pat. No. 7,029,591.

(51) Int. Cl.
*B44C 1/22* (2006.01)
*H01L 21/302* (2006.01)

(52) U.S. Cl. .................. 216/87; 38/38; 38/41; 38/52; 38/88; 205/640; 438/692

(58) Field of Classification Search ............ 216/38, 216/41, 52, 87, 88; 205/640; 438/692
See application file for complete search history.

(56) References Cited

U.S. PATENT DOCUMENTS

| 6,063,702 | A | * | 5/2000 | Chung | ........................ 438/624 |
| 6,087,262 | A | * | 7/2000 | Yang et al. | .................. 438/692 |
| 6,258,676 | B1 | * | 7/2001 | Lee et al. | .................... 438/296 |
| 6,815,336 | B1 | * | 11/2004 | Shue et al. | .................. 438/626 |
| 6,884,729 | B2 | * | 4/2005 | Lee et al. | .................... 438/704 |

* cited by examiner

*Primary Examiner*—Shamim Ahmed
(74) *Attorney, Agent, or Firm*—Luedeka, Neely & Graham

(57) ABSTRACT

A method of forming a planarized layer on a substrate, where the substrate is cleaned, and the layer is formed having a surface with high portions and low portions. A resistive mask is formed over the low portions of the layer, but not over the high portions of the layer. The surface of the layer is etched, where the high portions of the layer are exposed to the etch, but the low portions of the layer underlying the resistive mask are not exposed to the etch. The etch of the surface of the layer is continued until the high portions of the layer are at substantially the same level as the low portions of the layer, thereby providing an initial planarization of the surface of the layer. The resistive mask is removed from the surface of the layer, and all of the surface of the layer is planarized to provide a planarized layer.

5 Claims, 4 Drawing Sheets

PLANARIZATION WITH REDUCED DISHING

FIELD

This is a divisional of application Ser. No. 10/421,068 filed Apr. 23, 2003 now U.S. Pat. No. 7,029,591. This invention relates to the field of integrated circuit fabrication. More particularly, this invention relates to planarization of integrated circuit layers.

BACKGROUND

Consumers continually pressure integrated circuit manufacturers to provide devices that are smaller and faster, so that more operations can be performed in a given amount of time, using fewer devices that occupy a reduced amount of space and generate less heat. For many years, the integrated circuit fabrication industry has been able to provide smaller and faster devices, which tend to double in capacity every eighteen months or so.

However, as integrated circuits become smaller, the challenges of fabricating the devices tend to become greater. Fabrication processes and device configurations that didn't present any problems at a larger device size tend to resolve into new problems to be overcome as the device size is reduced. For example, in the past there was very little incentive to planarize the various layers from which integrated circuits are fabricated, and which are formed one on top of another. Because the devices themselves were relatively wide, the relatively thin layers that were formed did not present many challenges to overcome in regard to surface topography.

However, as the devices have been reduced in size they have become relatively narrower. Although layer thickness has also generally decreased, the surface topography of an underlying layer tends to create greater problems for the proper formation of the overlying layer to be formed, unless the underlying layer is planarized in some way prior to the formation of the overlying layer.

There are several different methods used for planarizing a layer on an integrated circuit. For example, chemical mechanical polishing can be used to physically and chemically erode the surface of the layer against a polishing pad in a slurry that contains both physically and chemically abrasive materials. Further, electropolishing can be used to thin an electrically conductive layer. Unfortunately, neither process tends to produce surface topographies that are as flat as desired.

For example, although each of these two planarization processes tends to preferentially remove higher portions of a layer, they also attack to at least some degree the lower portions of the layer. Thus, even the though the higher portions of the layer are removed at a rate that is somewhat greater than that of the lower portions, and hence some planarization does occur, there also tends to be some amount of dishing in the lower portions of the layer, where a greater amount of material is removed than is desired.

What is needed, therefore, is a method whereby the dishing of planarized layers is reduced.

SUMMARY

The above and other needs are met by a method of forming a planarized layer on a substrate, where the substrate is cleaned and the layer is formed having a surface with high portions and low portions. A resistive mask is formed over the low portions of the layer, but not over the high portions of the layer. The surface of the layer is etched, where the high portions of the layer are exposed to the etch, but the low portions of the layer underlying the resistive mask are not exposed to the etch. The etch of the surface of the layer is continued until the high portions of the layer are at substantially the same level as the low portions of the layer, thereby providing an initial planarization of the surface of the layer. The resistive mask is removed from the surface of the layer, and all of the surface of the layer is planarized to provide a planarized layer.

In this manner, material is selectively removed from the high portions of the layer, which brings them to a level that is more nearly that of the low portions of the layer. Thus, when the resistive mask is removed, the planarization process more effectively produces a truly planarized layer.

In various preferred embodiments, the layer is a metal layer, and most preferably is a copper layer. The resistive mask is preferably photoresist. The step of etching is preferably at least one of electropolishing the layer, wet etching the layer, or dry etching the layer. Preferably, the step of planarizing the surface is at least one of chemical mechanical polishing the surface and electropolishing the surface. The layer is preferably formed by depositing a barrier layer of at least one of tantalum nitride, tantalum, titanium nitride, and magnesium, depositing a seed layer of copper, and then electroplating copper. The substrate is preferably sputter cleaned using at least one of argon, hydrogen, and a fluorinated hydrocarbon.

According to another aspect of the invention there is described a method of forming a planarized layer on a substrate, where the substrate is cleaned and the layer is formed on the substrate having a surface with high portions and low portions. A resistive mask is formed over the high portions of the layer, but not over the low portions of the layer. The surface of the layer is treated to make it more resistive to planarization, where the low portions of the layer are exposed to the treatment, but the high portions of the layer underlying the resistive mask are not exposed to the treatment. The resistive mask is removed from the surface of the layer, and the surface of the layer planarized. The high portions of the layer are eroded at a first rate and the low portions of the layer are eroded at a second rate that is less than the first rate, due to the treatment received by the low portions of the layer, to provide a planarized layer.

In various preferred embodiments, the step of treating the surface of the layer includes at least one of implanting and plasma treating the surface of the layer with at least one of carbon, nitrogen, tantalum, tantalum nitride, titanium, and titanium nitride. Most preferably the layer is a copper layer. The step of planarizing the surface preferably includes at least one of chemical mechanical polishing the surface and electropolishing the surface.

According to yet another aspect of the invention there is described a method of forming a planarized layer on a substrate, where the substrate is cleaned and the layer is formed having a surface with high portions and low portions. A planar layer is formed over the layer, and the planar layer is planarized down to the high portions of the surface of the layer. The planar layer and the surface of the layer are both planarized using a process that planarizes both the planar layer and the layer at a substantially equal rate, until at least the planar layer is substantially completely removed, to provide a planarized layer. Preferably, the step of forming the planar layer includes depositing at least one of spin on glass and flow fill dielectric. The step of planarizing the planar layer preferably includes chemical mechanical polishing the planar layer. Preferably, the step of planarizing the planar layer and the surface of the layer includes at least one of chemical mechanical polishing and electropolishing.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
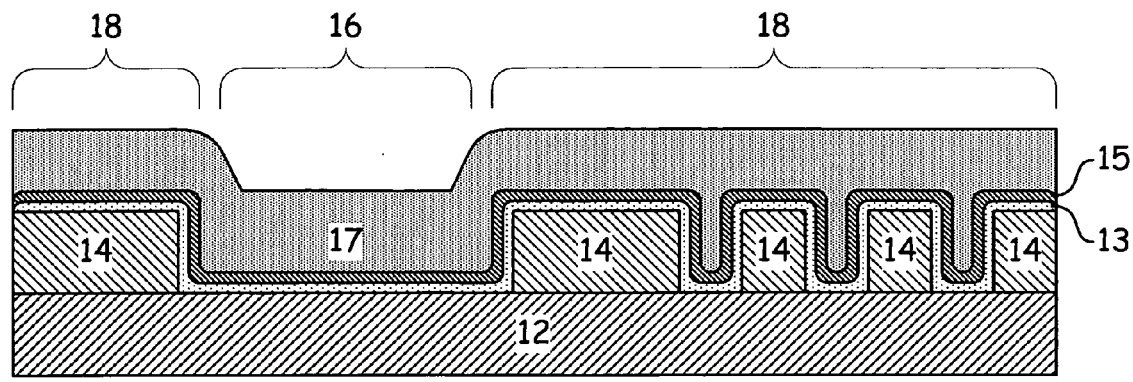
FIG. 1 is a cross sectional depiction of an integrated circuit showing a layer to be planarized, having high portions and low portions.

With reference now to FIG. 1, there is presented a cross sectional depiction of an integrated circuit 10 showing a layer 17 to be planarized, having high portions 18 and low portions 16. The low portions 16 tend to form in relatively larger and more open areas of the substrate, such as in pad or trenches areas between features 14, which are formed on the base substrate 12. It is appreciated that designation of "substrate" as used herein refers to either or both of the base substrate 12, or all of the layers—including the base substrate 12—on top of which another layer is formed.

The desired layer is preferably formed by first cleaning the substrate, such as with a sputter clean using at least one of argon, hydrogen, or a fluorinated hydrocarbon. Most preferably, about fifty angstroms of native oxide are removed by the cleaning process. In the most preferred embodiment, a barrier layer 13 is formed on the cleaned substrate. The barrier layer 13 is preferably formed of at least one of a variety of materials such as tantalum nitride, tantalum, titanium nitride, and magnesium. In the most preferred embodiment, a seed layer 15 is then formed, which is most preferably copper.

It is appreciated that the dimensions as depicted in the figures are not to scale, so that elements that are very small in comparison to other elements can be seen without undue complication of the figures. This is especially true in regard to the barrier layer 13 and the seed layer 15, which are depicted as being much thicker in relation to the other elements in the integrated circuit 10 than they actually are.

A layer 17 to be planarized is then formed over the barrier layer 13 and the seed layer 15. The layer 17 is preferably copper, and is most preferably formed in an electroplating deposition process. It is appreciated that the layer 17 may be formed of other materials, both metals and dielectrics, and that the underlying barrier layer 13 and seed layer 15 may or may not be present at all in a given embodiment. As seen in FIG. 1, the formation of the layer 17 produces a depression or low portion 16 between widely spaced elements 14, and also produces high portions 18 above and between the more closely spaced elements 14. It is appreciated that, dependent at least in part upon the height and spacing of the underlying elements 14, the surface topography of the layer 17 may be very complex in comparison to that as depicted in FIG. 1. However, there will still be high portions 18 and low portions 16 in such a complex surface topography, and the methods as described herein are applicable to all such surface topographies.

Figure 2:
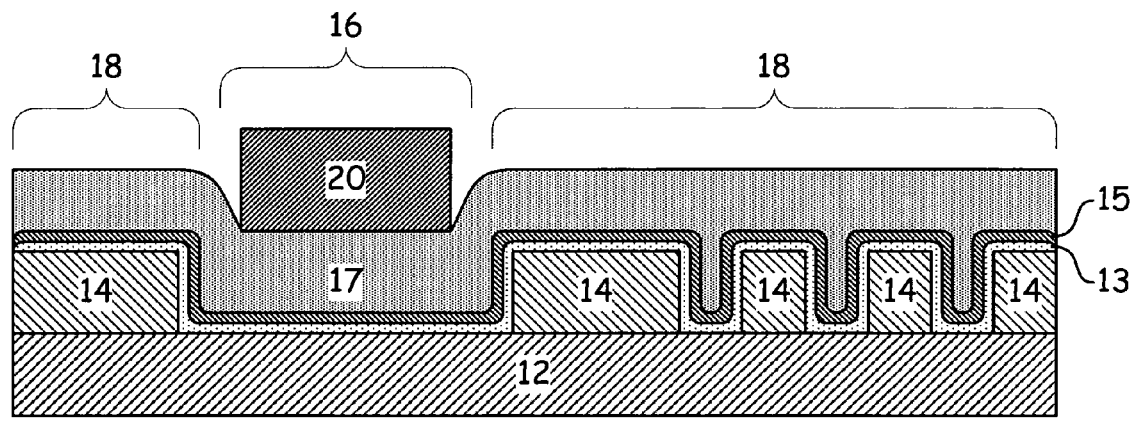
FIG. 2 is a cross sectional depiction of an integrated circuit showing a resistive layer overlying the low portions of the layer to be planarized.
Figure 3:
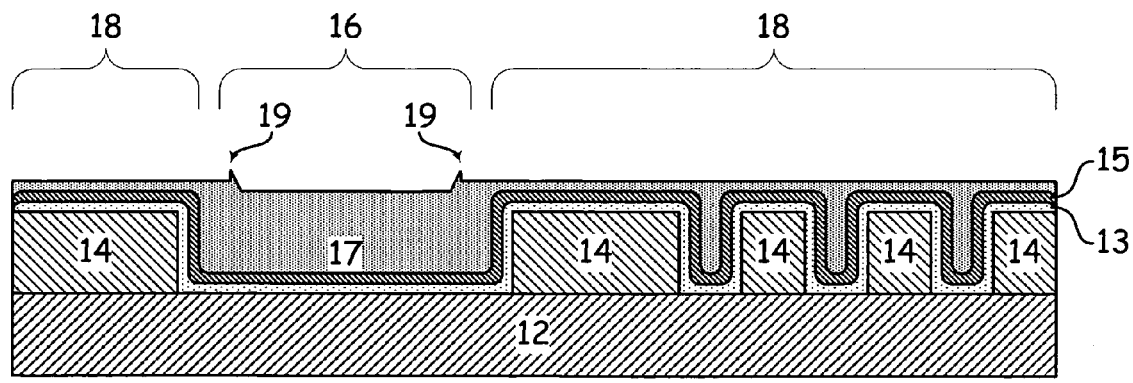
FIG. 3 is a cross sectional depiction of an integrated circuit showing high portions that have been removed to substantially the same level as the low portions.

According to a first embodiment of the invention, a resistive mask 20, such as photoresist, is formed on top of the surface of the layer 17 so as to overlie the low portions 16, and to not overlie the high portions 18, as depicted in FIG. 2. The surface of the layer 17 is then etched, so as to remove material from the high portions 18 of the layer 17, without removing material from the covered low portions 16 of the layer 17. The etching is preferably conducted until the level of the surface in the high portions 18 of the layer 17 is substantially equal to the level of the surface in the low portions 16 of the layer 17. When such an equalization has been substantially accomplished, the etching is stopped and the resistive layer 20 is removed, as depicted in FIG. 3.

The etching may be accomplished in one or more of a variety of ways, such as by wet etch, dry etch, or electropolishing. The type of etch process selected preferably depends at least in part on the material that is selected for the layer 17. Typically, such an etch will leave artifacts 19 near the edges of the resistive layer 17, because the change in levels from the low portions 16 to the high portions 18 will be sloped, rather than stepped. Thus, either the slope will be etched, or the slope will not be etched, or more likely, parts of the slope will be etched while other parts of the slope will not be etched. All such eventualities yield a condition where the entire surface of the layer 17 will not have been planarized during the etch process. However, the surface of the layer 17 will be far more uniform at this point than it was prior to the application of the resistive layer 20 and the etching process.

Figure 4:
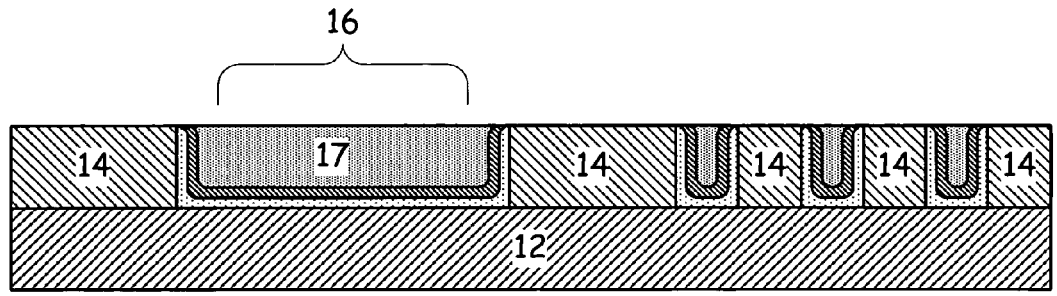
FIG. 4 is a cross sectional depiction of an integrated circuit showing a planarized layer.

A planarization process is then preferably accomplished on the layer 17. Because the layer 17 has been more completely leveled by the processes described above, the planarization process tends to not dish the low portions 16 below the top surface of the elements 14, as typically would have occurred had the planarization process been conducted prior the etching of the high portions 18. The planarization process is preferably at least one of chemical mechanical polishing and electropolishing, and yields the planarized structure as depicted in FIG. 4.

Figure 5:
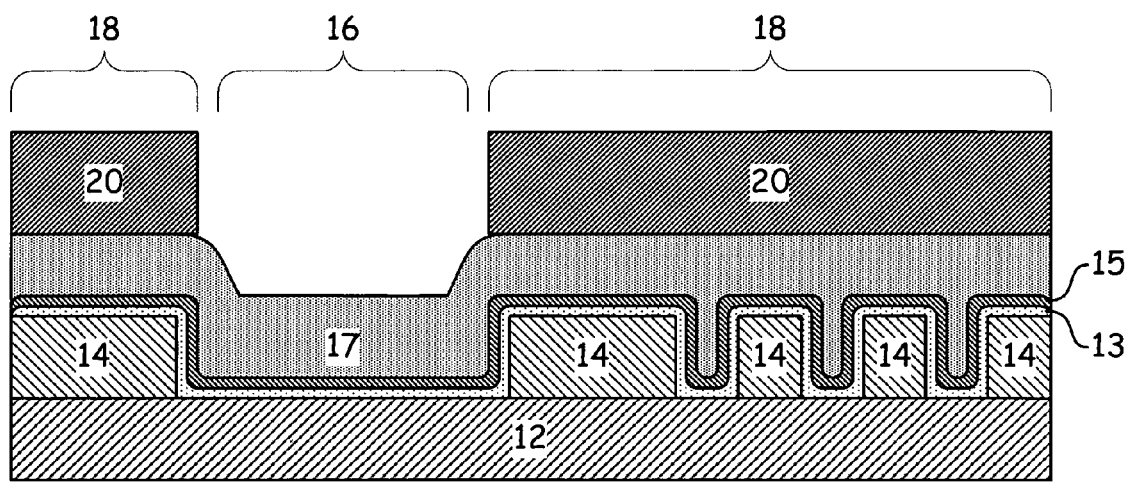
FIG. 5 is a cross sectional depiction of an integrated circuit showing a resistive layer overlying the high portions of the layer to be planarized.
Figure 6:
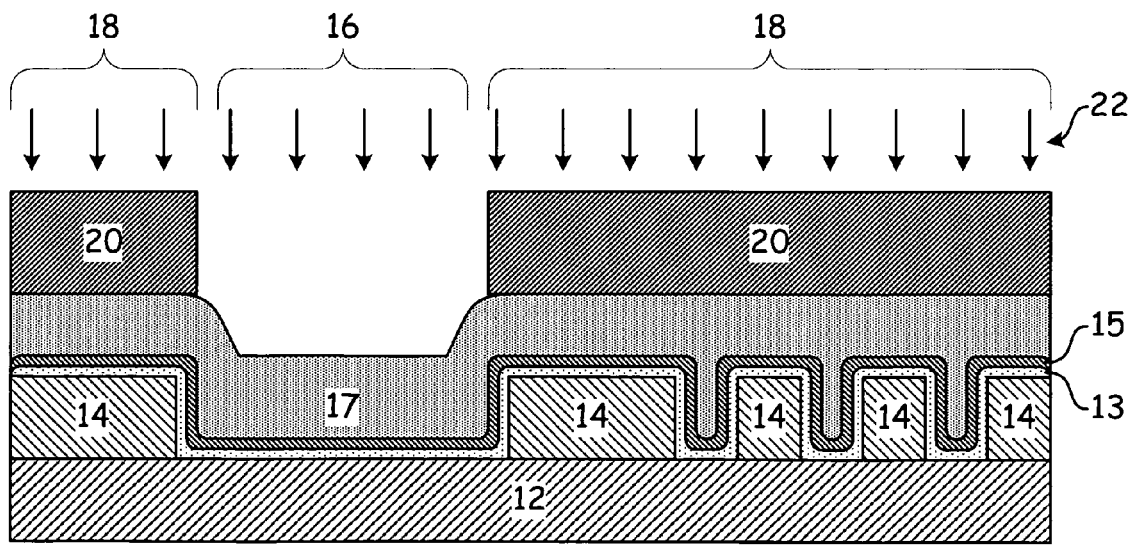
FIG. 6 is a cross sectional depiction of an integrated circuit showing a treatment process of the low portions of the layer to be planarized.

According to a second embodiment of the invention, a resistive mask 20 is again applied to the structure as depicted in FIG. 1. However, in this second embodiment the resistive mask 20 is applied to the high portions 18 of the structure, as depicted in FIG. 5. The layer 17 is then subjected to a treatment, whereby a species 22 such as at least one of carbon, nitrogen, tantalum, tantalum nitride, titanium, and titanium nitride is impregnated into the exposed surface of the low portion 16, as depicted in FIG. 6. This process can be accomplished such as by at least one of ion implantation or plasma treatment.

The actual selection of the impregnating species 22 is made based at least in part upon the material of the layer 17. The purpose of the impregnating species 22 is to reduce the rate of removal of material from the surface of the layer 17 in the low portions 16 during a subsequent process step, which is described in more detail below. Thus, the species 22 described above will accomplish such purposes when impregnated into copper, which is the preferred material for the layer 17.

Figure 7:
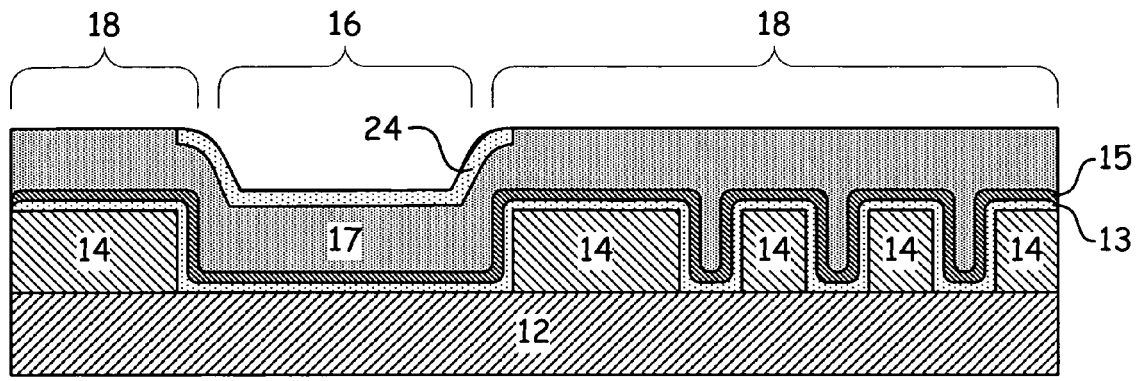
FIG. 7 is a cross sectional depiction of an integrated circuit showing the treated surface of the low portions of the layer to be planarized.
Figure 8:
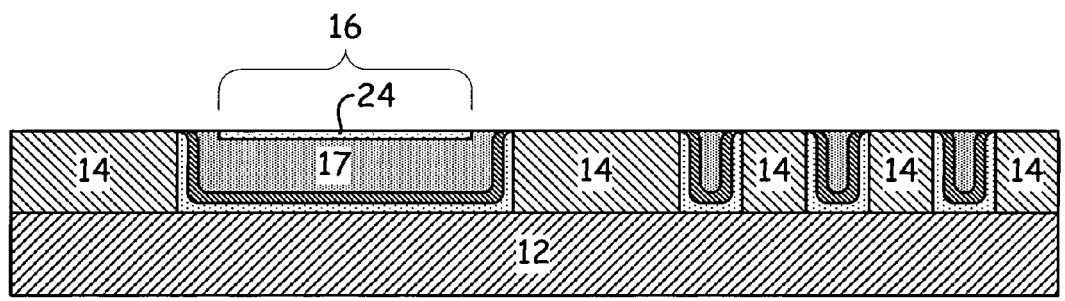
FIG. 8 is a cross sectional depiction of an integrated circuit showing the planarized layer.

Once the impregnation process is completed, the resistive layer 20 is preferably removed, as depicted in FIG. 7. Also depicted in FIG. 7 is the treated surface 24 in the low portions 16, in to which the species 22 has been impregnated. Because the surface 24 is more resistant to a planarization process, it tends to remove at a slower rate, thus reducing the incidence of dishing in the low portions 16. The layer 17 is preferably planarized such as by at least one of chemical mechanical polishing and electropolishing, to yield the planarized structure as depicted in FIG. 8. It is appreciated that all, some, or none of the treated surface 24 may remain at the completion of the planarization process.

Figure 9:
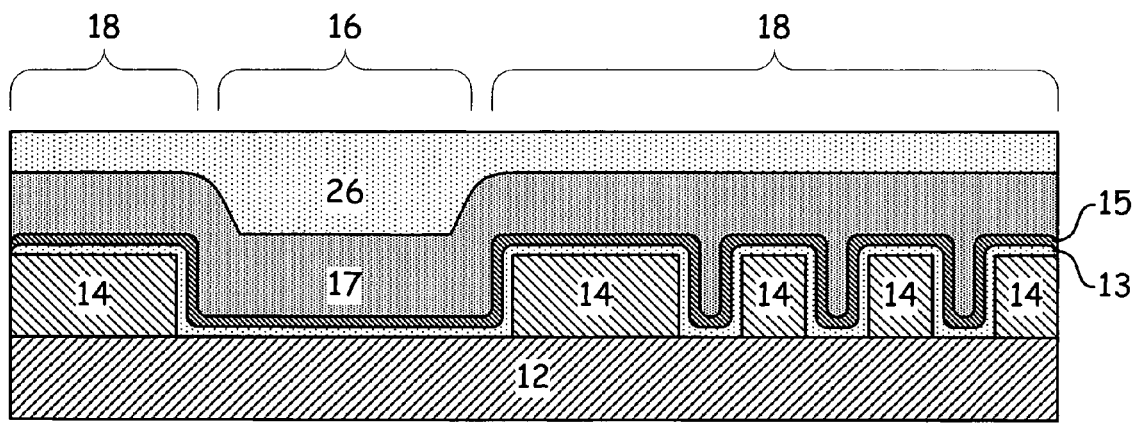
FIG. 9 is a cross sectional depiction of an integrated circuit showing a planar layer overlying the layer to be planarized.
Figure 10:
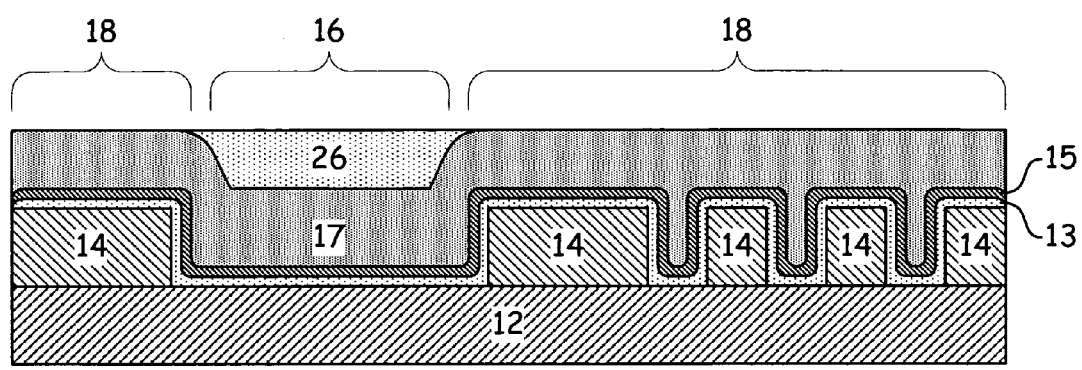
FIG. 10 is a cross sectional depiction of an integrated circuit showing the planar layer planarized down to the high portions of the layer to be planarized.

According to a third embodiment of the invention, the starting structure as depicted in FIG. 1 is overlaid with a planar layer 26, as depicted in FIG. 9. The planar layer 26 is preferably formed of at least one of spin on glass or flow fill dielectric, or some other material having similar properties, and which is consistent with the materials, processes, and structures as described herein. As depicted in FIG. 9, the planar layer 26 is preferably substantially planarized as formed, and covers both the low portions 16 and the high portions 18 of the layer 17 to be planarized.

The planar layer 26 is preferably planarized to the level of the high portions 18 of the layer 17, using whatever planarization process works well on the material of the planar layer 26, such as chemical mechanical polishing or electropolishing. Most preferably the planarization process selected provides a highly planarized surface in the planar layer 26. The surface of the planar layer 26 is preferably not planarized past the point at which the highest point of the high portions 18 is exposed.

Once a highest point of the high portions 18 is exposed in the first planarization process described above, a second planarization process is used. The second planarization process preferably has a one to one selectivity between the material of the planar layer 26 and the layer 17, or in other words, removes material from the planar layer 26 at substantially the same rate as it does from the layer 17. Again, this may be a process such as chemical mechanical polishing or electropolishing, and may in some embodiments be the same process as that used to planarize the planar layer 26 down to the highest level of the high portions 18 of the layer 17. However, in most embodiments there will be at least some adjustment of processing parameters between the first planarization and the second planarization, even if the same process method is used for each of the two planarizations.

Figure 11:
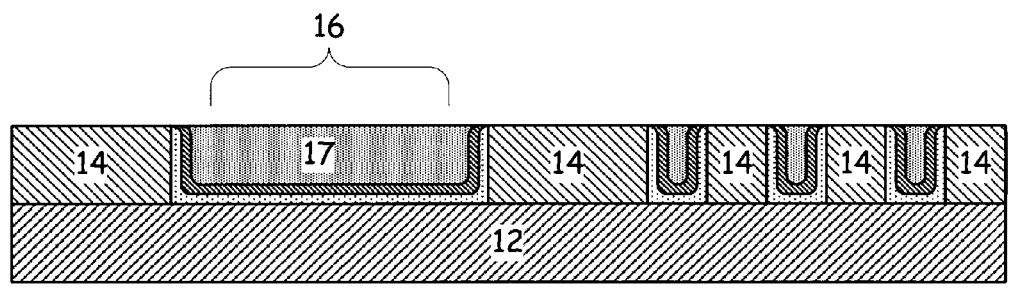
FIG. 11 is a cross sectional depiction of an integrated circuit showing the planarized layer.

Because the second planarization process removes the material of the planar layer 26 at substantially the same rate as that of the layer 17, there is no dishing of the layer 17 in the low portions 16 of the layer, yielding the structure as depicted in FIG. 11. Thus, the present invention produces a highly planarized surface in a layer 17, without producing the dishing artifacts that are typically seen at the completion of such processes.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a planarized layer on a substrate, the method comprising the steps of:

cleaning the substrate, forming the layer having a surface with relatively high portions and relatively low portions, forming a resistive mask over the relatively high portions of the layer and not over the relatively low portions of the layer, treating the surface of the layer to make it more resistive to planarization, where the relatively low portions of the layer are exposed to the treatment and the relatively high portions of the layer underlying the resistive mask are not exposed to the treatment, removing the resistive mask from the surface of the layer, and planarizing the surface of the layer, where the relatively high portions of the layer are eroded at a first rate and the relatively low portions of the layer are eroded at a second rate that is less than the first rate due to the treatment received by the relatively low portions of the layer, to provide a planarized layer.

2. The method of claim 1, wherein the step of treating the surface of the layer comprises implanting at least one of carbon, nitrogen, tantalum, tantalum nitride, titanium, and titanium nitride.

3. The method of claim 1, wherein the step of treating the surface of the layer comprises plasma treatment with at least one of carbon, nitrogen, tantalum, tantalum nitride, titanium, and titanium nitride.

4. The method of claim 1, wherein the layer is a copper layer.

5. The method of claim 1, wherein the step of planarizing the surface comprises at least one of chemical mechanical polishing the surface and electropolishing the surface.

* * * * *